United States Patent
Tamura et al.

(10) Patent No.: US 6,953,729 B2
(45) Date of Patent: Oct. 11, 2005

(54) HETEROJUNCTION FIELD EFFECT TRANSISTOR AND MANUFACTURING METHOD THEREOF

(75) Inventors: Akiyoshi Tamura, Suita (JP); Keisuke Kojima, Uozu (JP); Yoshiaki Kato, Bizen (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/625,630

(22) Filed: Jul. 24, 2003

(65) Prior Publication Data

US 2004/0079965 A1 Apr. 29, 2004

(30) Foreign Application Priority Data

Oct. 24, 2002 (JP) ........................................ 2002-309692

(51) Int. Cl.[7] .............................................. H01L 21/336
(52) U.S. Cl. ............................ 438/285; 438/22; 438/46; 438/47; 438/590; 257/94; 257/102; 257/103; 257/183; 257/192
(58) Field of Search ...................... 257/76–78, 183–201

(56) References Cited

U.S. PATENT DOCUMENTS

| | | | | |
|---|---|---|---|---|
| 3,914,785 A | * | 10/1975 | Ketchow ...................... 257/96 |
| 3,923,875 A | * | 12/1975 | Rose et al. .................. 560/244 |
| 4,188,710 A | * | 2/1980 | Davey et al. ................ 438/508 |
| 4,471,366 A | * | 9/1984 | Delagebeaudeuf et al. . 257/194 |
| 4,593,301 A | * | 6/1986 | Inata et al. .................. 257/194 |
| 4,673,959 A | * | 6/1987 | Shiraki et al. ................. 257/20 |
| 5,060,031 A | * | 10/1991 | Abrokwah et al. .......... 257/274 |
| 5,144,410 A | * | 9/1992 | Johnson ....................... 257/745 |
| 5,381,027 A | * | 1/1995 | Usagawa et al. ............ 257/192 |
| 5,480,829 A | * | 1/1996 | Abrokwah et al. .......... 438/169 |
| 5,825,052 A | * | 10/1998 | Shakuda ........................ 257/94 |
| 5,907,164 A | * | 5/1999 | Nakayama ................... 257/192 |
| 6,194,747 B1 | * | 2/2001 | Onda .......................... 257/192 |

FOREIGN PATENT DOCUMENTS

JP 03250742 A * 11/1991 ......... H01L/21/338

OTHER PUBLICATIONS

J. Abrokwah, et al., "A Manufactuable Complementary GaAs Process", IEEE, 1993, pp. 127–130.
N. Hayafuji, et al., "Thermal Stability of AlInAs/GaInAs/InP Heterostructures", American Institute of Physics, Feb. 1995, pp. 863–865.

* cited by examiner

*Primary Examiner*—Andy Huynh
(74) *Attorney, Agent, or Firm*—Stevens, Davis, Miller & Mosher, LLP

(57) ABSTRACT

In a heterojunction FET in which source and drain areas are formed by carrying out high temperature annealing process after carrying out ion implantation in areas to be formed into source and drain areas, conventionally, the N-type carrier supply layer and the N-type active layer are doped with Si. In place of doping with Si, doping with Se or Te is adopted. Thereby, in high temperature annealing process for activating the ion implanted areas, which serves as source and drain areas, unlike the Si donor, inactivation of donor due to reaction with F-atoms occurs scarcely with respect to the diffusion of F-atoms on the surface of the epitaxial substrate, which adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

10 Claims, 13 Drawing Sheets

HETEROJUNCTION FIELD EFFECT TRANSISTOR AND MANUFACTURING METHOD THEREOF

BACKGROUND OF THE INVENTION

1. Field of the Invention

The present invention relates to a field effect transistor (hereinafter, referred to as FET) using a heterojunction epitaxial substrate and a manufacturing method thereof.

2. Description of the Related Art

Since an FET of which source/drain area of a heterojunction FET is formed in a self-aligning manner with respect to the gate electrode using ion implantation has only a small parasitic resistance in the source/drain, it is expected as a process which realize a high performance enhancement type FET (for example, refer to "J. K. Abrokwah et al, GaAs IC Symposium Digest, P127–130, 1993").

In the above heterojunction FET, for the carrier supply layer which supplies electron to the active layer, or for the active layer in which no carrier supply layer is provided but the active layer itself is doped, a layer doped with Si is mainly used.

However, to activate an ion implanted area which serves as the source/drain area, a high temperature annealing process is indispensable. Due to the annealing process, there arises such problem as the heterojunction is changed in nature resulting in a deterioration of the FET characteristics. Conventionally, as a doping material for the N-type carrier supply layer or active layer itself of the epitaxial substrate used for the heterojunction FET, a Si (silicon) donor is mainly used. Since the Si donor is a dipolar impurity, due to the high temperature annealing process for activating the ion implanted area to form the source/drain area, the Si is displaced from the ordinary Ga grid position to the As grid position resulting in a decrease of activation. Further, due to the above-described high temperature annealing process, the Si donor forms compound matters with diffused F (fluorosis)-atoms, which adhered on the surface of the substrate in the process such as hydrofluoric acid processing, etching using $CF_4$ gas, or the like, resulting in an inactivation. As a result, the carrier density decreases resulting in a deterioration of the FET characteristics. It has been reported by HAYAHUJI et al, that, particularly in hetero group of InAlAs/InGaAs, the Si donor is inactivated by F-atoms in the heat treatment at a temperature of around 400° C. (Appl. Phys. Lett., Vol. 66, P863–865, 1995). The inventor et al. has found that the above phenomenon occurs also in high temperature annealing process for activating ion implanted area.

SUMMERY OF THE INVENTION

The present invention has been proposed in view of the above problems. Accordingly, an object of the invention is to provide a high performance heterojunction FET of little deterioration of the FET characteristics due to annealing process for activating ion implanted area and manufacturing method thereof.

In order to achieve the above-mentioned object, in the present invention, as a doping material for the N-type carrier supply layer and N-type active layer, in place of conventionally used Si, Se or Te is used. The Se and Te require a large energy for combining with F-atom, and unlike the Si, hardly forms compound matter with F-atom. Accordingly, by using these atoms as a doping impurity, even when a high temperature annealing process is carried out, a heterojunction FET of little deterioration of the FET characteristics can be obtained. Further, since both of the Se and Te are atoms from VI-family, in the grid of atom from either III-family or V-family, they serve as a donor.

The heterojunction FET of the invention is a heterojunction field effect transistor, which comprises a semiconductor layer forming substrate formed with a plurality of semiconductor layers on a semi-insulative substrate, a gate electrode formed on the semiconductor layer forming substrate, N-type source area and drain area formed by carrying out ion implantation to form N-type semiconductor on predetermined areas in the semiconductor layer forming substrate at both sides of the gate electrode, and by carrying out annealing process for activating the ion implanted areas, an active layer including a predetermined semiconductor layer in the plurality of semiconductor layers between the source area and the drain area, and an N-type carrier supply layer for supplying electron to the active layer formed on the upper or both of the upper and lower the semiconductor layers of the active layer between the source area and the drain area, wherein at least one of the semiconductor layers to be the N-type carrier supply layer is doped with Selenium (Se) or Tellurium (Te).

According to the above structure, in the N-type carrier supply layer, doping with Se or Te is made in place of Si which is conventionally used. In high temperature annealing process for activating the ion implanted areas, which serves as source and drain areas, unlike the Si donor, inactivation of donor due to reaction with F-atoms occurs scarcely with respect to the diffusion of F-atoms on the surface of the semiconductor layer forming substrate, which adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

In the invention, the semiconductor layer that serves as the active layer may be an InGaAs layer, and the semiconductor layer that serves as the N-type carrier supply layer may be an AlGaAs layer. Or, the semiconductor layer that serves as the active layer may be an InGaAs layer, the semiconductor layer that serves as the N-type carrier supply layer may be an InAlAs layer. Or, the semiconductor layer that serves as the active layer may be a GaAs layer, and the semiconductor layer that serves as the N-type carrier supply layer may be an AlGaAs layer.

Further, the heterojunction FET of the invention is a heterojunction field effect transistor, which comprises a semiconductor layer forming substrate formed with a plurality of semiconductor layers on a semi-insulative substrate, a gate electrode formed on the semiconductor layer forming substrate, N-type source area and drain area formed by carrying out ion implantation to form N-type semiconductor on predetermined areas in the semiconductor layer forming substrate at both sides of the gate electrode, and by carrying out annealing process for activating the ion implanted areas, and an N-type active layer formed of a predetermined semiconductor layer in the plurality of semiconductor layers between the source area and the drain area, wherein the semiconductor layer to be the N-type active layer is doped with Selenium (Se) or Tellurium (Te).

According to the above structure, in the N-type active layer, doping with Se or Te is carried out in place of Si which is conventionally used. In high temperature annealing process for activating the ion implanted areas, which serves as source and drain areas, unlike the Si donor, inactivation of donor due to reaction with F-atoms occurs scarcely with respect to the diffusion of F-atoms on the surface of the semiconductor layer forming substrate, which adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

In the invention, the semiconductor layer that serves as the N-type active layer may be either one of InGaAs layer, GaAs layer and InP layer.

Further, the manufacturing method of the heterojunction FET according to the invention is a manufacturing method of a heterojunction field effect transistor which comprising the steps of forming a semiconductor layer forming substrate having a plurality of semiconductor layers including at least a semiconductor layer, which serves as an active layer, and a semiconductor layer at the upper side or at the both upper and lower sides of the active layer, which serves as an N-type carrier supply layer for supplying electron to the active layer, on a semi-insulative substrate, forming a gate electrode on the semiconductor layer forming substrate, and forming N-type source area and drain area by carrying out ion implantation for forming N-type semiconductors in predetermined areas of the semiconductor layer forming substrate at the both sides of the gate electrode and by carrying out annealing process for activating the ion implanted areas, wherein, when forming the semiconductor layer forming substrate, at least one semiconductor layer to be the N-type carrier supply layer is doped with Selenium (Se) or Tellurium (Te).

According to the above structure, in the N-type carrier supply layer, doping with Se or Te is carried out in place of Si which is conventionally used. In the high temperature annealing process for activating the ion implanted areas, which serves as source and drain areas, unlike the Si donor, inactivation of donor due to reaction with F-atoms occurs scarcely with respect to the diffusion of F-atoms on the surface of the semiconductor layer forming substrate, which are adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

In the invention, when forming the semiconductor layer forming substrate, an InGaAs layer may be formed as the semiconductor layer, which serves as the active layer, and an AlGaAs layer may be formed as the semiconductor layer, which serves as the N-type carrier supply layer. Or, an InGaAs layer may be formed as the semiconductor layer, which serves as the active layer, and an InAlAs layer may be formed as the semiconductor layer, which serves as the N-type carrier supply layer. Or, a GaAs layer may be formed as the semiconductor layer, which serves as the active layer, and an AlGaAs layer may be formed as the semiconductor layer, which serves as the N-type carrier supply layer. The annealing process for forming N-type source area and drain area is preferably carried out in a manner of lamp annealing. In this case, ion implanted areas, which serve as the source area and the drain area, can be activated at a high temperature in a short period of time.

Further, the manufacturing method of the heterojunction FET according to the invention is a manufacturing method of a heterojunction field effect transistor which comprises the steps of forming a semiconductor layer forming substrate having a plurality of semiconductor layers including at least a semiconductor layer, which serves as an N-type active layer, on a semi-insulative substrate, forming a gate electrode on the semiconductor layer forming substrate, and forming N-type source area and drain area by carrying out ion implantation for forming N-type semiconductors in predetermined areas of the semiconductor layer forming substrate at the both sides of the gate electrode and by carrying out annealing process for activating the ion implanted areas, wherein, when forming the semiconductor layer forming substrate, the semiconductor layer to be the N-type active layer is doped with Selenium (Se) or Tellurium (Te).

According to the above structure, in the N-type active layer, doping with Se or Te is made in place of Si which is conventionally used. In high temperature annealing process for activating the ion implanted areas, which serves as source and drain areas, unlike the Si donor, inactivation of donor due to reaction with F-atoms occurs scarcely with respect to the diffusion of F-atoms on the surface of the semiconductor layer forming substrate, which are adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

In the invention, when forming semiconductor layer forming substrate, any one of InGaAs layer, GaAs layer and InP layer may be formed as the semiconductor layer, which serves as the N-type active layer. The annealing process for forming N-type source area and drain area is preferably carried out in a manner of lamp annealing. In this case, ion implanted areas, which serve as the source area and the drain area, can be activated at a high temperature in a short period of time.

DESCRIPTION OF THE PREFERRED EMBODIMENTS

Figure 1:
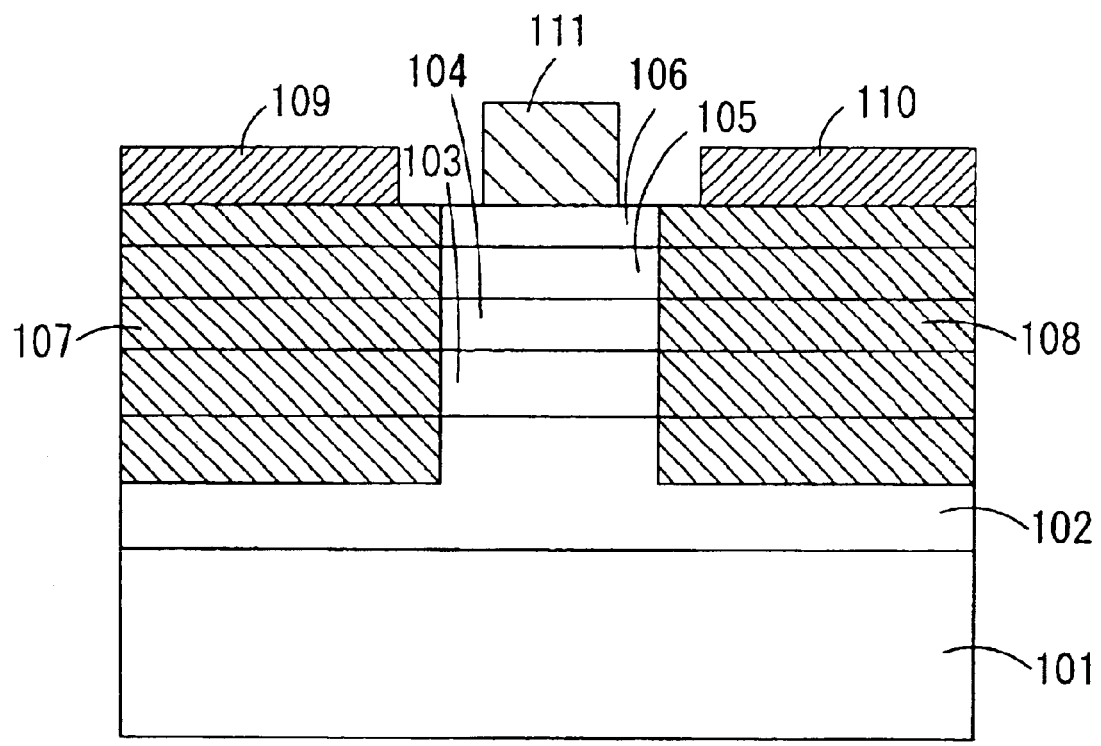
FIG. 1 is a cross sectional view showing a structure of a heterojunction FET according to a first embodiment of the present invention.

Now, referring to the drawings, embodiments of the invention will be described.

(First Embodiment)

FIG. 1 is a cross sectional view showing a structure of a heterojunction FET according to a first embodiment of the invention. In FIG. 1, formed on a semi-insulative GaAs substrate 101 are an undoped GaAs buffer layer 102, an undoped $In_{0.2}Ga_{0.8}As$ layer 103 that serves as an active layer, an undoped $Al_{0.2}Ga_{0.8}As$ layer 104 that serves as a spacer, an N-type $Al_{0.2}Ga_{0.8}As$ layer 105 doped with Te, which serves as a carrier supply layer for supplying electron to the active layer, and an undoped GaAs layer 106. Reference numeral 107 denotes an $N^+$-type source area formed of an Si ion implanted area, 108 denotes an $N^+$-type drain area formed of an Si ion implanted area, 109 denotes a source electrode formed of a material from AuGe/Ni group, 110 denotes a drain electrode formed of a material from AuGe/Ni group, and 111 denotes a gate electrode formed of WSi/W.

Figure 2A:
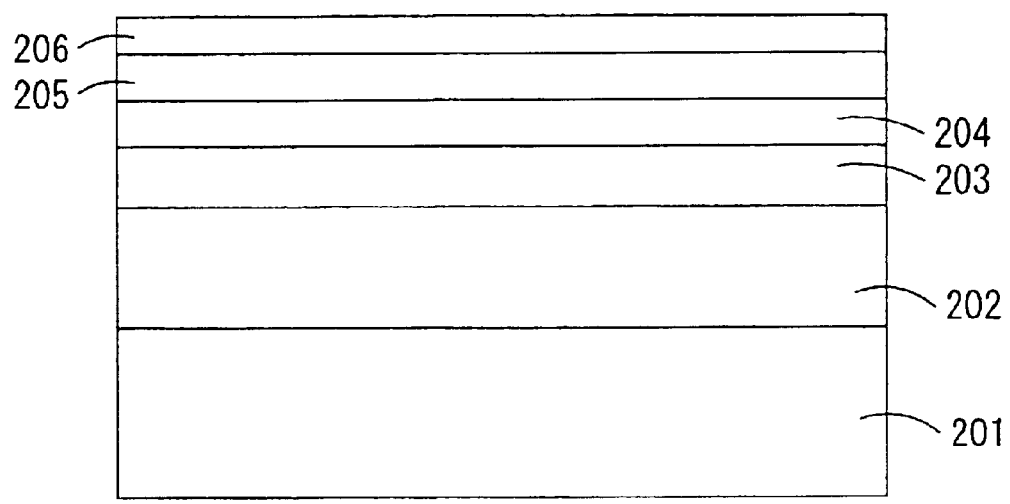
FIG. 2A–FIG. 2F are cross sectional views showing the process steps in a manufacturing method of the heterojunction FET according to the first embodiment of the invention.

Next, referring to FIGS. 2A–2F, an example of manufacturing method of the heterojunction FET shown in FIG. 1 will be described. As shown in FIG. 2A, formed sequentially on a semi-insulative GaAs substrate 201 using a MOCVD (metalorganic chemical vapor deposition) are an undoped GaAs buffer layer 202 of 1 μm in thickness, an undoped $In_{0.2}Ga_{0.8}As$ layer 203 of 15 nm in thickness which serves as an active layer, an undoped $Al_{0.2}Ga_{0.8}As$ layer 204 of 2 nm in thickness which serves as a spacer, an N-type $Al_{0.2}Ga_{0.8}As$ layer 205 doped with Te (carrier density: $2\times10^{18}cm^{-3}$) of 15 nm in thickness which serves as a carrier supply layer, and an undoped GaAs layer 206 of 5 nm in thickness to prepare an epitaxial substrate (semiconductor layer forming substrate).

Figure 2B:
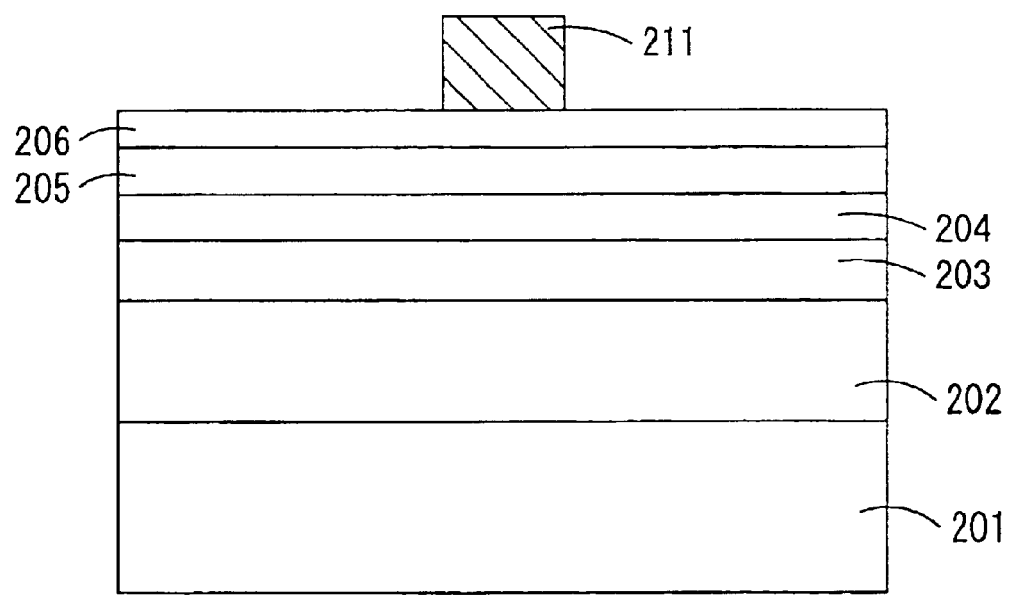

Then, as shown in FIG. 2B, after forming WSi/W films (thickness 10 nm/30 nm) on the upper surface of the substrate in a manner of sputtering, a dry etching of $CF_4/SF_6$ mixed gas is carried out using a photoresist mask to form a gate electrode 211 of FET in a predetermined area.

Figure 2C:
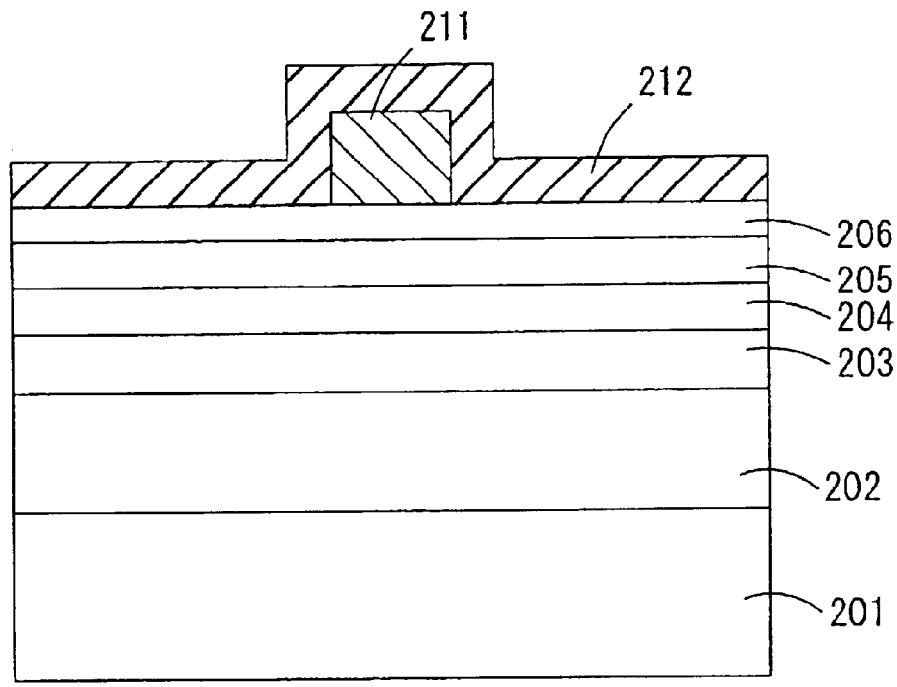

Then, as shown in FIG. 2C, a plasma SiN film 212 of 200 nm in thickness is formed on the upper surface in a manner of plasma CVD. In this case, a SiN film 212 of 150 nm in thickness is formed on the side surfaces of the gate electrode 211.

Figure 2D:
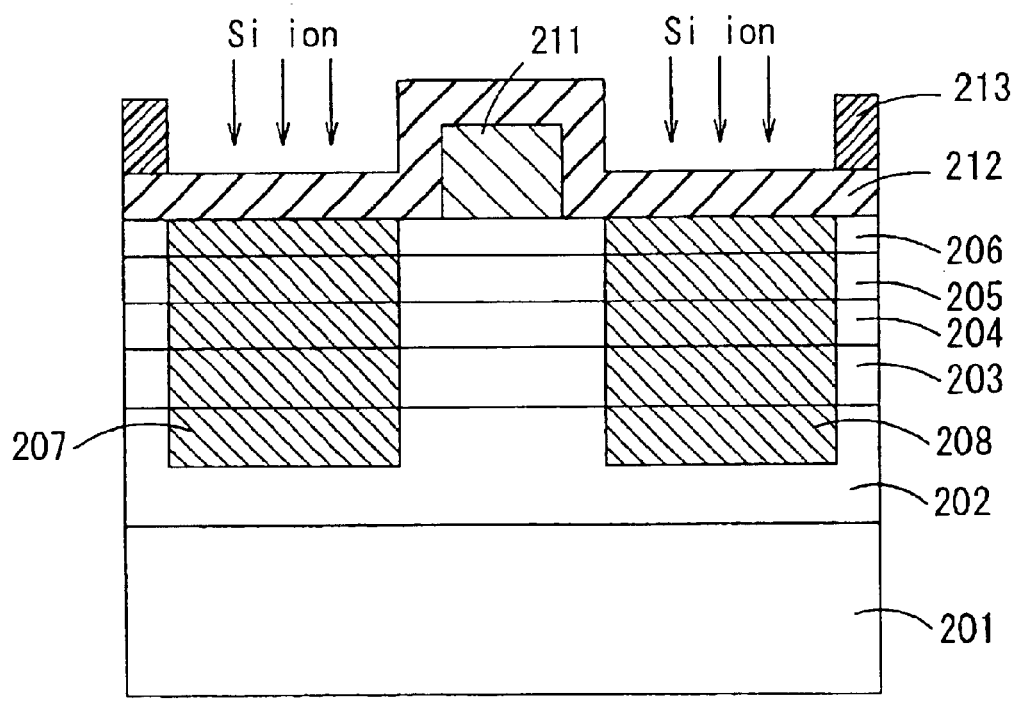

Then, as shown in FIG. 2D, a photoresist mask 213 is formed in a predetermined area, and Si ion is implanted at an acceleration voltage of 80 keV, and dose amount of $7\times10^{13}cm^{-2}$ in a self-aligning manner with respect to the gate electrode 211 to form a source area 207 and a drain area 208. Under the implantation conditions as described above, although the Si ion passes through the plasma SiN film 212 and is implanted in the areas to be formed with source/drain, the Si ion does not reach the surface of the substrate where is immediately under the gate electrode 211 and the plasma SiN film 212 formed on the side walls, and the Si ion is implanted into the gate electrode 211 leaving a gap equivalent to the film thickness of the plasma SiN film 212 formed on the side walls of the gate electrode 211.

Figure 2E:
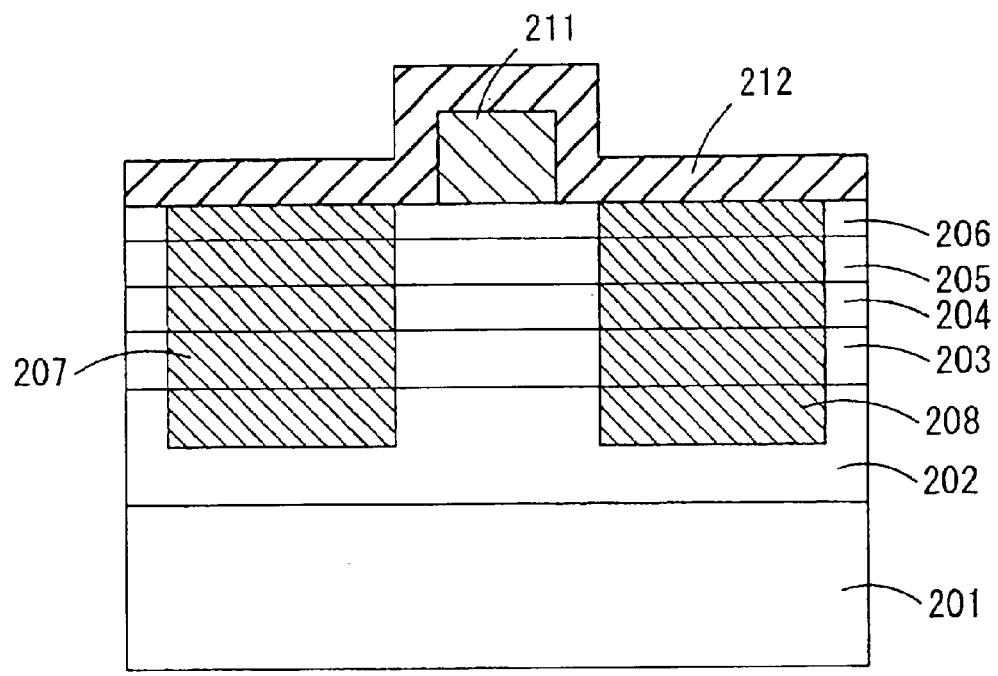

Then, as shown in FIG. 2E, after removing the photoresist mask 213, using the plasma SiN film 212 as an anneal protective film, annealing is made in a manner of lamp annealing for 5 seconds in an $N_2$ atmosphere at a temperature of 800° C. to activate the ion implanted area. Appropriate temperature for annealing is 700–850° C.; and appropriate annealing time is for 2–15 seconds. If these ranges are exceeded, heterojunction interface is largely deteriorated. While, if these ranges are not satisfied, unsatisfactory activation is resulted in.

Figure 2F:
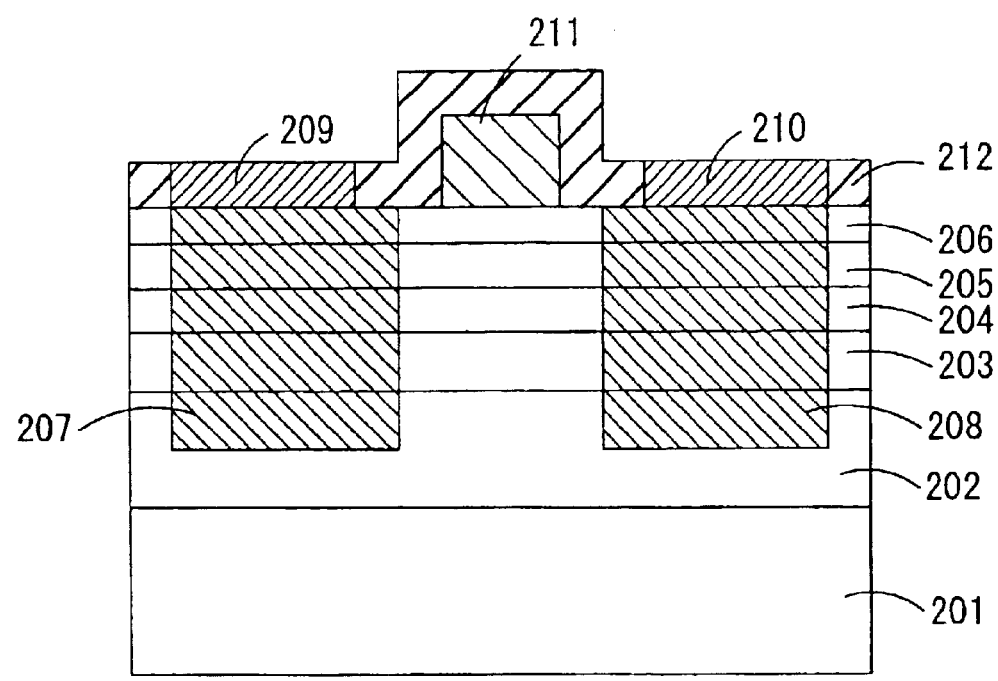

Then, as shown in FIG. 2F, using a photoresist mask (not shown), the plasma SiN film 212 in a predetermined area is opened in a manner of dry etching using a material from $CF_4$ group. After forming AuGe/Ni/Au films (thickness: 100 nm/40 nm/200 nm) in a lift-off manner using a resistance heating evaporation system, a source electrode 209 and a drain electrode 210 are formed by carrying out sintering for 60 seconds in an atmosphere of $N_2$, at a temperature of 400° C. to complete the FET.

Figure 3A:
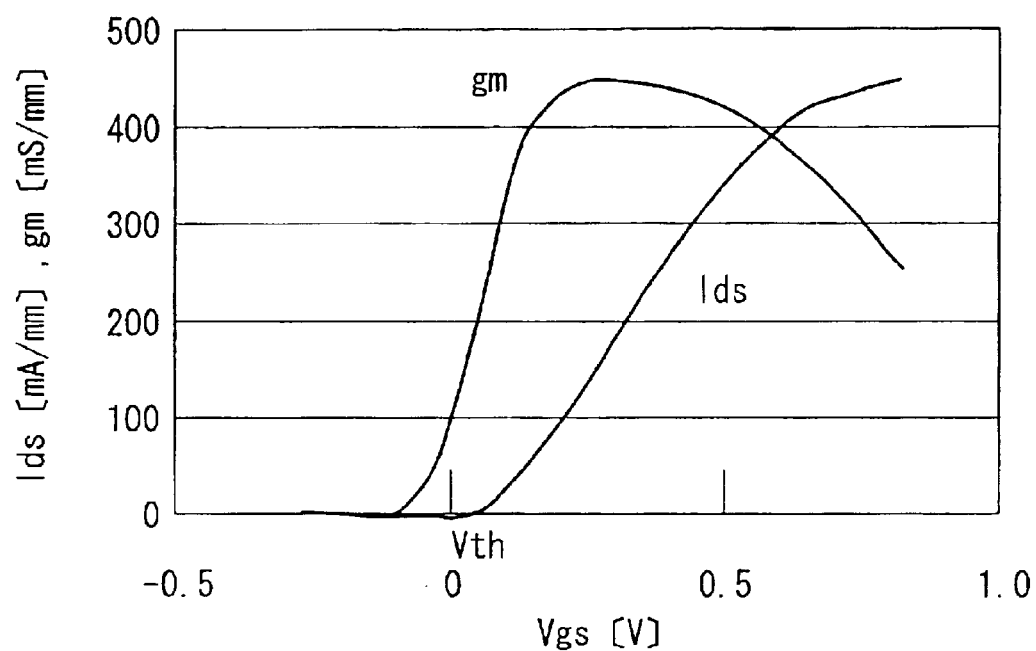
FIG. 3A is a diagram showing characteristics of the heterojunction FET according to the first embodiment of the invention.
Figure 3B:
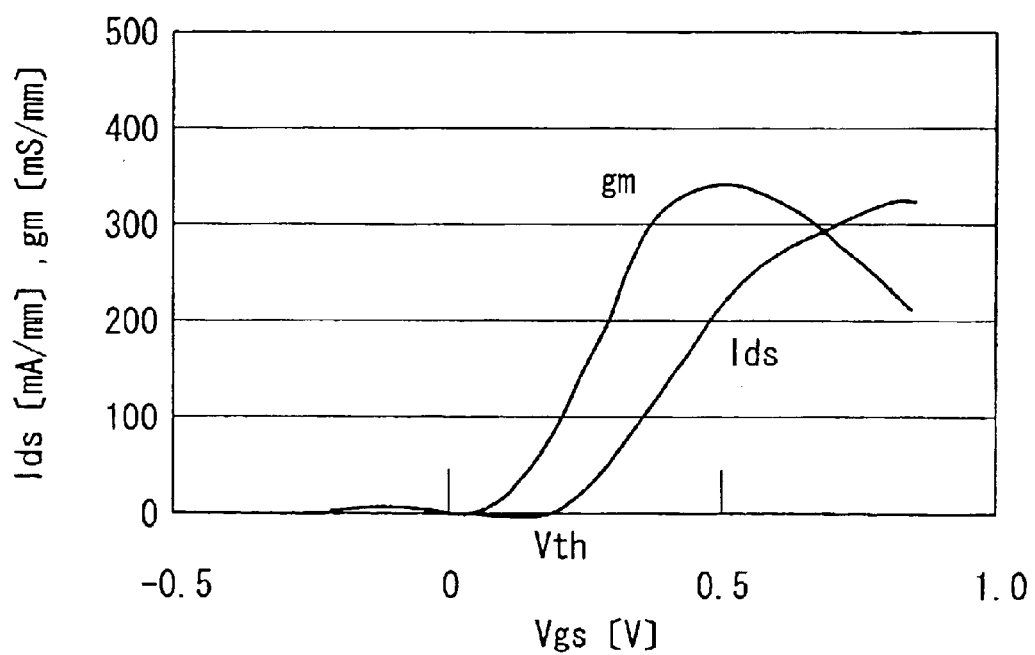
FIG. 3B is a diagram showing characteristics of a conventional heterojunction FET.

FIG. 3A shows characteristics between the gate voltage Vgs and the drain current Ids & the transfer conductance gm in the FET according to the first embodiment; FIG. 3B shows characteristics between the gate voltage Vgs and the drain current Ids & the transfer conductance gm in a conventional FET. Here, in the conventional FET, the N-type carrier supply layer (105, 205) in the structure of the FET according to the first embodiment is doped with Si in place of Te. In any case, a heterojunction FET having a size of 0.5 μm in gate length and 100 μm in gate width is used respectively. In FIG. 3A and FIG. 3B, Vth denotes a threshold voltage and is a gate voltage Vgs when the drain current Ids of the heterojunction FET is zero. Compared to the conventional FET, the FET according to the first embodiment has a lower threshold voltage Vth and higher transfer conductance gm resulting in a higher saturation drain current (Ids). Thus, it is understood that a satisfactory characteristics is obtained.

Figure 4:
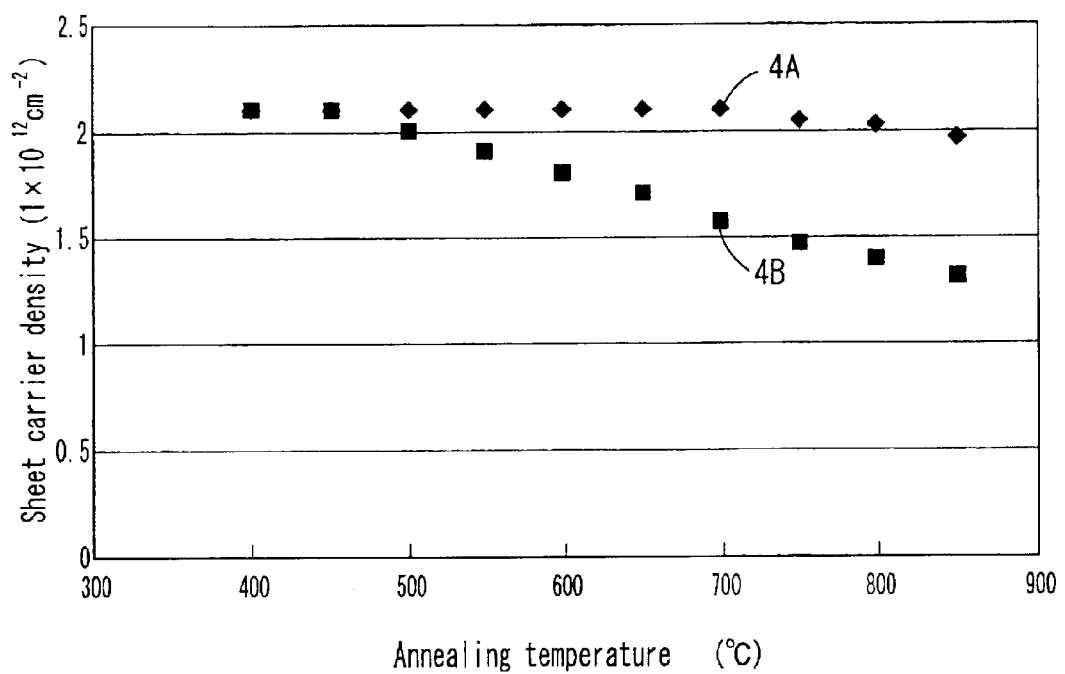
FIG. 4 is a diagram showing annealing temperature dependence of the sheet carrier density in the epitaxial substrate for heterojunction FET according to the first embodiment of the invention and an epitaxial substrate for the conventional heterojunction FET.

FIG. 4 is a comparison of annealing temperature dependence in sheet carrier density (Ns) between the heterojunction epitaxial substrate used in the first embodiment and the conventional heterojunction epitaxial substrate having the same structure as the above and a carrier supply layer (105, 205), which is doped, not with Te, but with Si. Reference symbol 4A denotes the characteristics of the first embodiment; reference symbol 4B denotes the characteristics of the conventional case. A lamp anneal is used for annealing and period of annealing time is fixed to for 5 seconds. FIG. 4 demonstrates that, in the conventional epitaxial substrate doped with Si, the Ns begins to decrease due to annealing at a temperature of approximately 500° C. or more, and at a temperature of 850° C., the Ns is approximately 70% thereof at a temperature of 400° C. The reason of this is why F-atoms adhered to the surface of the epitaxial substrate during the process are, due to the annealing, diffused in the substrate forming compound matters with Si atoms resulting in inactivation of the Si donors. On the other hand, Te hardly reacts with F-atom. In the epitaxial substrate doped with Te as the case of the first embodiment, the decrease of the Ns due to the high temperature annealing can be reduced. Also, since the Te is an impurity from VI-family, compared to a Si impurity, the Te gives fewer influence of grid displacement position due to the annealing.

As described above, according to the first embodiment, in the N-type carrier supply layer (105, 205), doping with Te is made in place of Si which is conventionally used. Hence, in annealing process for activating the ion implanted area which serves as the source/drain area, unlike the conventional Si donor, inactivation of donor due to reaction with F-atoms occurs scarcely, with respect to the diffusion of F-atoms on the surface of the epitaxial substrate, which adhered during the process such as hydrofluoric acid treatment, etching using $CF_4$ gas or the like. Further, since the Te is an impurity from VI-family, when the Te occupies any grid position of atoms from III-family or V-family, the Te serves as the donor. Accordingly, a high performance heterojunction FET of little deterioration of the FET characteristics can be obtained.

The above-described hydrofluoric acid treatment is used, for example, in a washing process of the semi-insulative substrate (in the first embodiment, semi-insulative GaAs substrate) or in a wet etching of the $SiO_2$ film. Further, the etching using the above $CF_4$ gas is a dry etching of, for example, SiN film, $SiO_2$ film or WSi film.

(Second Embodiment)

Figure 5:
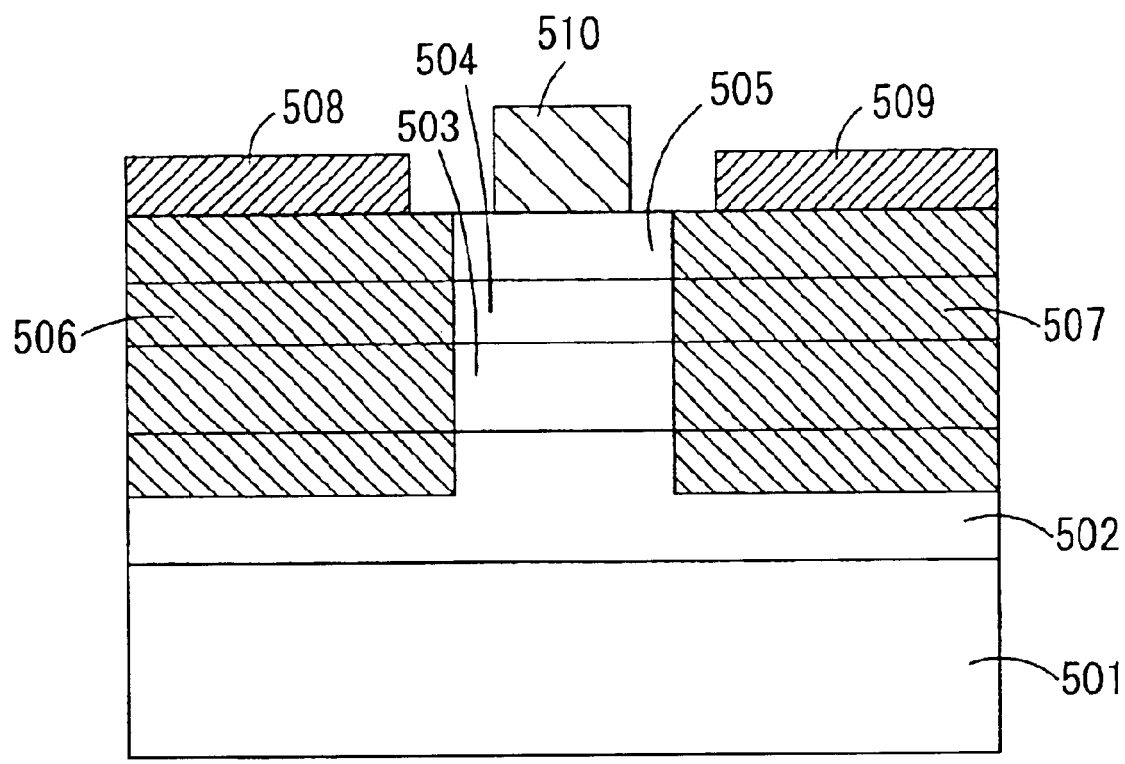
FIG. 5 is a cross sectional view showing a structure of a heterojunction FET according to a second embodiment of the invention.

FIG. 5 is a cross sectional view showing a structure of a heterojunction FET according to a second embodiment of the invention. In FIG. 5, formed on a semi-insulative GaAs substrate 501 are an undoped GaAs buffer layer 502, an N-type $In_{0.2}Ga_{0.8}As$ layer 503 doped with Te that serves as an active layer, an undoped $Al_{0.2}Ga_{0.8}As$ layer 504, and an undoped GaAs layer 505. Reference numeral 506 denotes an $N^+$-type source area formed of an Si ion implanted area, 507 denotes an $N^+$-type drain area formed of an Si ion implanted area, 508 denotes a source electrode formed of materials from AuGe/Ni group, 509 denotes a drain electrode formed of materials from AuGe/Ni group, and 510 denotes a gate electrode formed from WSi/W.

The second embodiment is different from the first embodiment in a point that the structure has no carrier supply layer, and the active layer is doped with Te.

The manufacturing method of the heterojunction FET according to the second embodiment is different from the case of the first embodiment up to a point that the epitaxial substrate is formed; and after the epitaxial substrate has been formed, the manufacturing method thereof is the same as that of the first embodiment. In the second embodiment, the undoped GaAs buffer layer 502, the N-type $In_{0.2}Ga_{0.8}As$ layer 503 doped with Te that serves as the active layer, the undoped $Al_{0.2}Ga_{0.8}As$ layer 504, the undoped GaAs layer 505 are formed subsequently on the semi-insulative GaAs substrate 501 using a MOCVD (metalorganic chemical vapor deposition) to manufacture the epitaxial substrate.

According to the second embodiment, in the N-type active layer (503), doping with Te is made in place of Si which is conventionally used. Hence, in annealing process for activating the ion implanted area that serves as source/drain area, unlike the conventional Si donor, inactivation of donor due to reaction with F-atoms occurs scarcely with respect to the diffusion of F-atoms on the surface of the epitaxial substrate, which are adhered during the process such as hydrofluoric acid treatment, etching using $CF_4$ gas or the like. Further, since the Te is an impurity from VI-family, when the Te occupies any grid position of atoms from III-family or V-family, the Te serves as the donor. Accordingly, a high performance heterojunction FET of little deterioration of the FET characteristics can be obtained.

(Third Embodiment)

Figure 6:
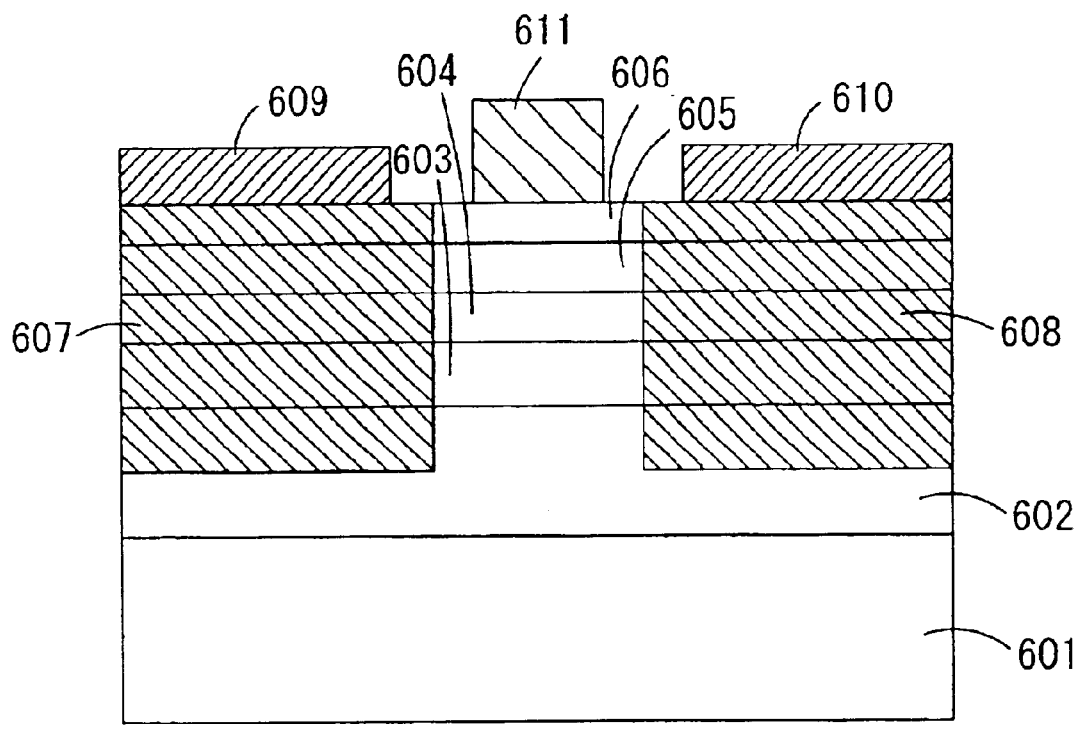
FIG. 6 is a cross sectional view showing a structure of a heterojunction FET according to a third embodiment of the invention.

FIG. 6 is a cross sectional view showing a structure of a heterojunction FET according to a third embodiment of the invention. In FIG. 6, formed on a semi-insulative GaAs substrate 601 are an undoped GaAs buffer layer 602, an $In_{0.2}Ga_{0.8}As$ layer 603 that serves as an active layer, an undoped $Al_{0.2}Ga_{0.8}As$ layer 604 that serves as a spacer, an N-type $Al_{0.2}Ga_{0.8}As$ layer 605 doped with Se, which serves as a carrier supply layer for supplying electron to the active layer, and an undoped GaAs layer 606. Reference numeral 607 denotes an $N^+$-type source area formed of a Si ion implanted area, 608 denotes an $N^+$-type drain area formed of a Si ion implanted area, 609 denotes a source electrode formed of materials from AuGe/Ni group, 610 denotes a drain electrode formed of materials from AuGe/Ni group, and 611 denotes a gate electrode formed from WSi/W.

The structure according to the third embodiment is the structure of the first embodiment shown in FIG. 1, in which N-type $Al_{0.2}Ga_{0.8}As$ layer 105 doped with Te, which serves as the carrier supply layer, is replaced with the N-type $Al_{0.2}Ga_{0.8}As$ layer 605 doped with Se. Same as the Te, the Se also hardly reacts with F-atom. Also, since the Se is an impurity from VI-family, when the Se occupies any grid position of atoms from III-family or V-family, the Se serves as the donor. The FET characteristics deteriorate little against the high temperature annealing. Accordingly, the same effect as the above embodiments can be obtained.

The manufacturing method of the heterojunction FET according to the third embodiment is the same as that of the first embodiment excepting a point that the N-type $Al_{0.2}Ga_{0.8}As$ layer 605 doped with Se is formed in place of the $Al_{0.2}Ga_{0.8}As$ layer 105 (205) doped with Te in the first embodiment.

Further, it is needless to say that, in the second embodiment, even when the N-type $In_{0.2}Ga_{0.8}As$ layer 503 doped with Te, which serves as the active layer, is replaced with an N-type $In_{0.2}Ga_{0.8}As$ layer doped with Se, the same effect as the above embodiments can be obtained. The manufacturing method of the heterojunction FET in this case is the same as that of the second embodiment excepting a point that the N-type $In_{0.2}Ga_{0.8}As$ layer doped with Se is formed in place of the N-type $In_{0.2}Ga_{0.8}As$ layer 503 doped with Te in the second embodiment.

(Fourth Embodiment)

Figure 7:
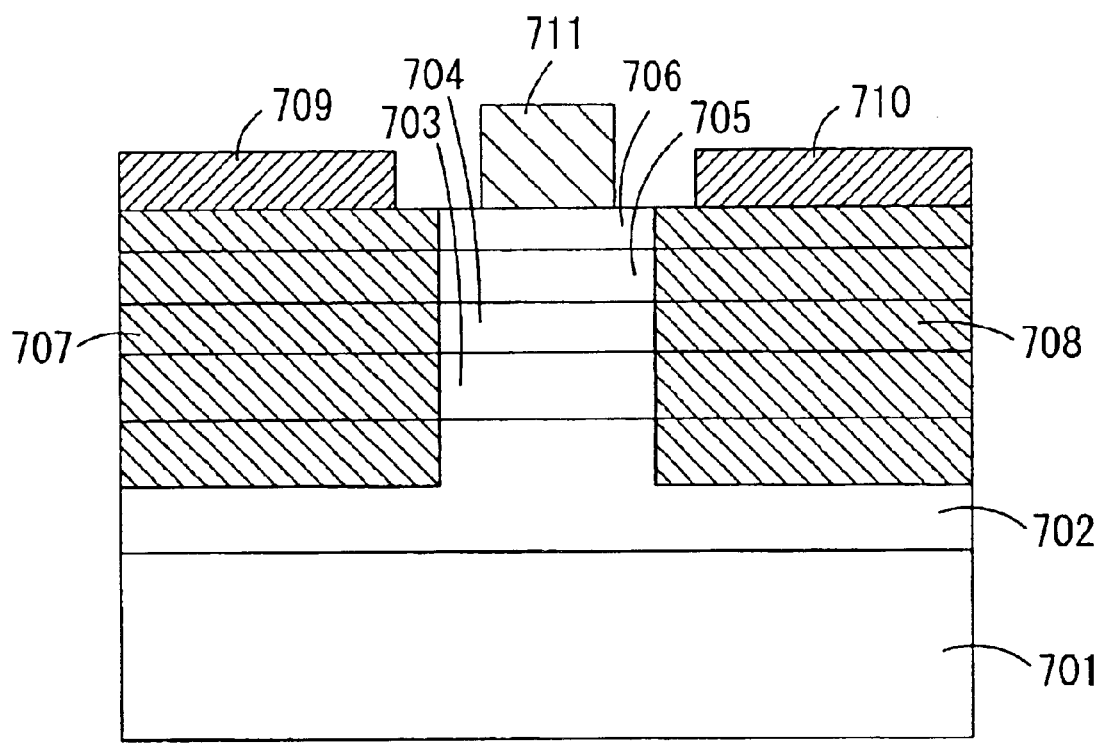
FIG. 7 is a cross sectional view showing a structure of a heterojunction FET according to a fourth embodiment of the invention.

FIG. 7 is a cross sectional view showing a structure of a heterojunction FET according to a fourth embodiment of the invention. In FIG. 7, formed on a semi-insulative InP substrate 701 are an undoped $In_{0.52}Al_{0.42}As$ buffer layer 702, an undoped $In_{0.53}Ga_{0.47}As$ layer 703 which serves as an active layer, an undoped $In_{0.52}Al_{0.48}As$ layer 704 that serves as a spacer, an N-type $In_{0.52}Al_{0.48}As$ layer 705 doped with Te, which serves as a carrier supply layer for supplying electron to the active layer, and an undoped $In_{0.52}Al_{0.48}As$ layer 706. Reference numeral 707 denotes an $N^+$-typesource area formed of a Si ion implanted area, 708 denotes an $N^+$-type drain area formed of Si ion implanted area, 709 denotes a source electrode formed of materials from AuGe/ Ni group, 710 denotes a drain electrode formed of materials from AuGe/Ni group, and 711 denotes a gate electrode formed from WSi/W.

The above structure is a hetero type structure which makes grid-align with respect to the InP substrate. In the fourth embodiment, since the N-type $In_{0.52}Al_{0.48}As$ layer 705, in which the carrier supply layer is doped with Te, is used, the same effect as that of the first embodiment can be obtained. The manufacturing method of the heterojunction FET according to the fourth embodiment is the same as that of the first embodiment excepting a point that epitaxial layers 702–706 are formed subsequently on the semi-insulative InP substrate 701 to form the epitaxial substrate.

It is needless to say that, even when the N-type $In_{0.52}Al_{0.48}As$ layer 705 doped with Te, which serves as the carrier supply layer, is replaced with the N-type $In_{0.52}Al_{0.48}As$ layer doped with Se, the same effect as the above can be obtained.

(Fifth Embodiment)

Figure 8:
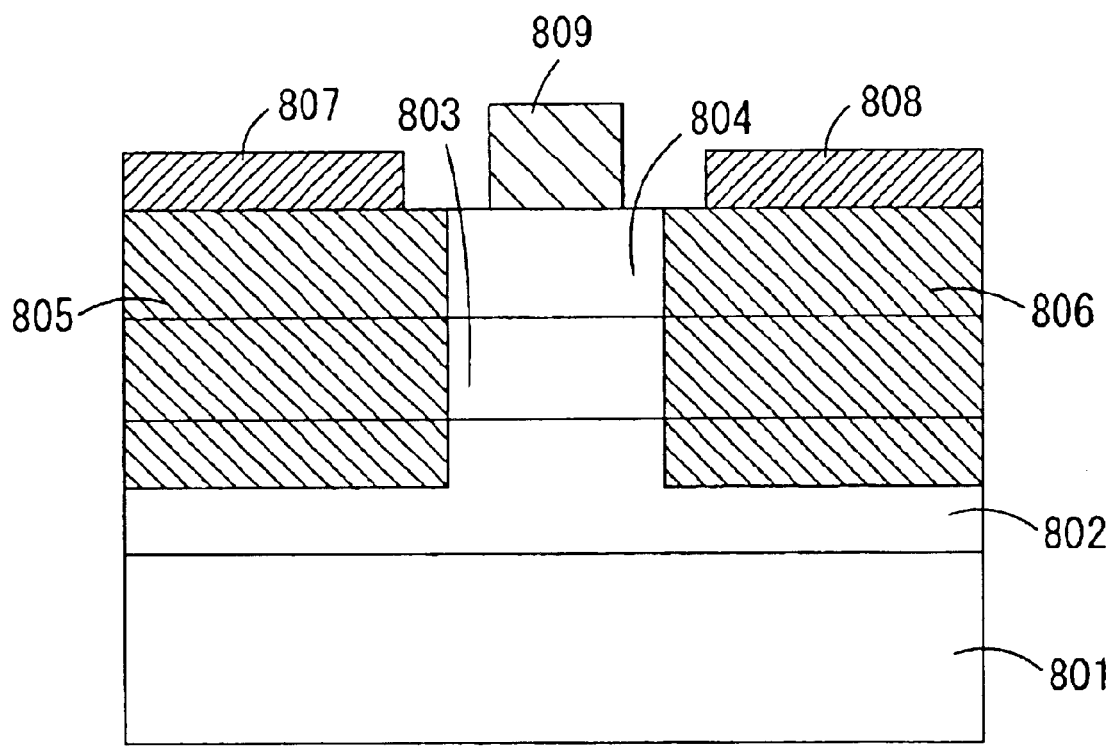
FIG. 8 is a cross sectional view showing a structure of a heterojunction FET according to a fifth embodiment of the invention.

FIG. 8 is a cross sectional view showing a structure of a heterojunction FET according to a fifth embodiment of the invention. In FIG. 8, formed on a semi-insulative InP substrate 801 are an undoped $In_{0.52}Al_{0.42}As$ buffer layer 802, an N-type $In_{0.53}Ga_{0.47}As$ layer 803 doped with Te, which serves as an active layer, and an undoped $In_{0.52}Al_{0.48}As$ layer 804. Reference numeral 805 denotes an $N^+$-type source area formed of a Si ion implanted area, 806 denotes an $N^+$-type drain area formed of a Si ion implanted area, 807 denotes a source electrode formed of materials from AuGe/Ni group, 808 denotes a drain electrode formed of materials from AuGe/Ni group, and 809 denotes a gate electrode formed from WSi/W.

The fifth embodiment has a hetero-type structure same as that shown in FIG. 7, and the structure is the same as the that of the fourth embodiment excepting a point that no carrier supply layer is provided, and the active layer is doped with Te. According to the fifth embodiment, since the N-type $In_{0.53}Ga_{0.47}As$ layer 803 doped with Te is used as the active layer, the same effect as that of the first embodiment can be obtained. The manufacturing method of the heterojunction FET according to the fifth embodiment is the same as that of the first embodiment excepting a point that epitaxial layers 802–804 are formed subsequently on the semi-insulative InP substrate 801 to form the epitaxial substrate.

It is needless to say that, even when the N-type $In_{0.53}Ga_{0.47}As$ layer 803 doped with Te, which serves as the active layer, is replaced with the N-type $In_{0.53}Ga_{0.47}As$ layer doped with Se, the same effect as the above can be obtained.

As described above, in the first to the third embodiments, the heterojunction FET of AlGaAs/InGaAs group, in which an InGaAs layer on a GaAs substrate is used as the active layer, has been described. And in the fourth and fifth embodiments, heterojunction FET of InAlAs/InGaAs group in which an InGaAs layer on an InP substrate is used as the active layer has been described. The invention is applicable to a heterojunction FET of AlGaAs/GaAs group in which a GaAs layer on a GaAs substrate is used as the active layer, and to a heterojunction FET of InGaAs/InP group, in which an InP layer on an InP substrate is used as the active layer in the same manner. Embodiments of these applications will be described bellow.

(Sixth Embodiment)

Figure 9:
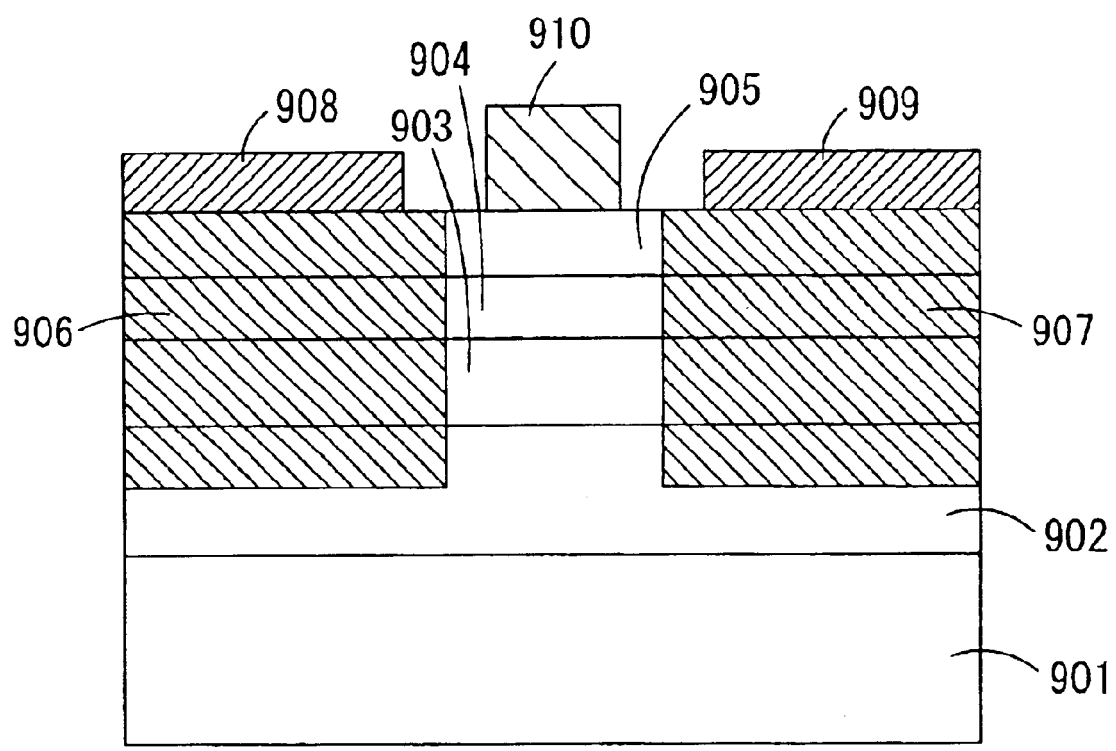
FIG. 9 is a cross sectional view showing a structure of a heterojunction FET according to a sixth embodiment of the invention.

FIG. 9 is a cross sectional view showing a structure of a heterojunction FET according to a sixth embodiment of the invention. In FIG. 9, formed on a semi-insulative GaAs substrate 901 are an undoped GaAs layer 902 which serves as an active layer, an undoped $Al_{0.2}Ga_{0.8}As$ layer 903 which serves as a spacer, an N-type $Al_{0.2}Ga_{0.8}As$ layer 904 doped with Te, which serves as a carrier supply layer, and an undoped GaAs layer 905. Reference numeral 906 denotes an $N^+$-type source area formed of an Si ion implanted area, 907 denotes an $N^+$-type drain area formed of an Si ion implanted area, 908 denotes a source electrode formed of materials from AuGe/Ni group, 909 denotes a drain electrode formed of materials from AuGe/Ni group, and 910 denotes a gate electrode formed from WSi/W.

The sixth embodiment is an example in which the active layer is a GaAs layer and the carrier supply layer is an AlGaAs layer. In the sixth embodiment, since the $Al_{0.2}Ga_{0.8}As$ layer 904 doped with Te is used as the carrier supply layer, the same effect as that of the first embodiment can be obtained. The manufacturing method of the heterojunction FET according to the sixth embodiment is the same as that of the first embodiment excepting a point that epitaxial layers 902-905 are formed subsequently on the semi-insulative GaAs substrate 901 to form epitaxial substrate.

It is needless to say that, even when the N-type $Al_{0.2}Ga_{0.8}As$ layer 904 doped with Te, which serves as the carrier supply layer, is replaced with the N-type $Al_{0.2}Ga_{0.8}As$ layer doped with Se, the same effect as the above can be obtained.

(Seventh Embodiment)

Figure 10:
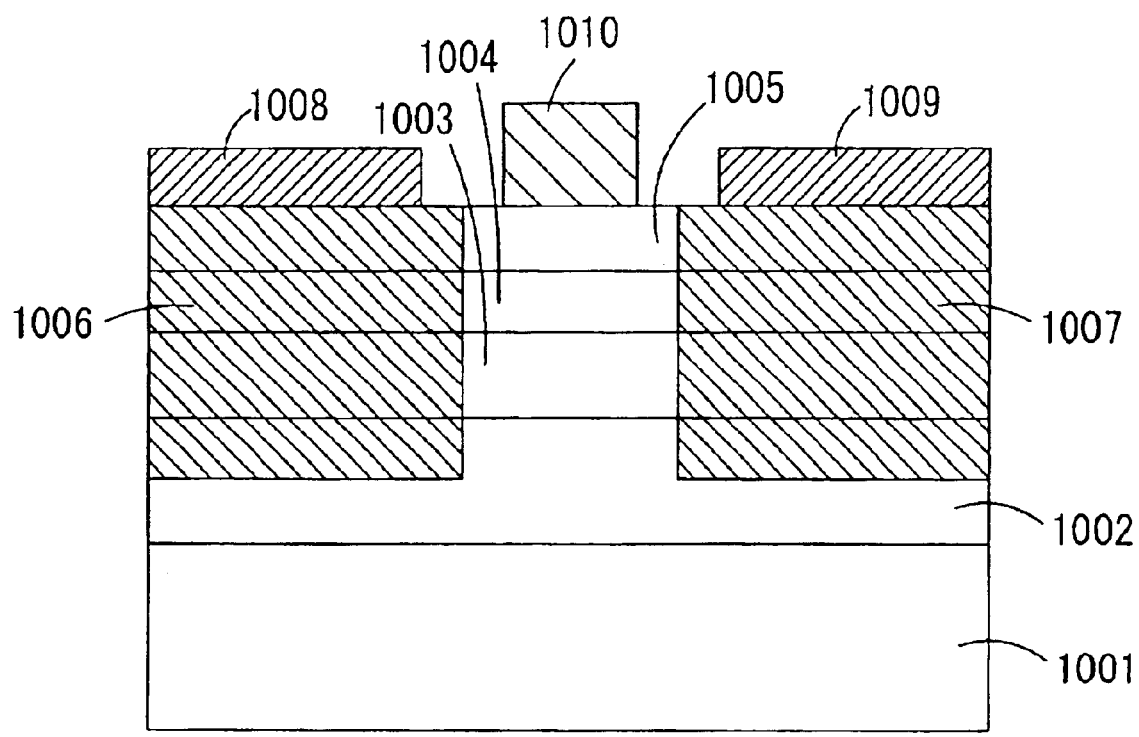
FIG. 10 is a cross sectional view showing a structure of a heterojunction FET according to a seventh embodiment of the invention.

FIG. 10 is a cross sectional view showing a structure of a heterojunction FET according to a seventh embodiment of the invention. In FIG. 10, formed on a semi-insulative GaAs substrate 1001 are an undoped GaAs buffer layer 1002, an N-type GaAs layer 1003 doped with Te, which serves as an active layer, an undoped $Al_{0.2}Ga_{0.8}As$ layer 1004, and an undoped GaAs layer 1005. Reference numeral 1006 denotes an $N^+$-type source area formed of a Si ion implanted area, 1007 denotes an $N^+$-type drain area formed from a Si ion implanted area, 1008 denotes a source electrode formed of materials from AuGe/Ni group, 1009 denotes a drain electrode formed of materials from AuGe/Ni group, and 1010 denotes a gate electrode formed from WSi/W.

The seventh embodiment is an example of a case in which no carrier supply layer is provided and the active layer is an N-type GaAs layer doped with Te. According to the seventh embodiment, since the N-type GaAs layer 1003 doped with Te is used as the active layer, the same effect as that of the first embodiment can be obtained. The manufacturing method of the heterojunction FET according to the seventh embodiment is the same as that of the first embodiment excepting a point that epitaxial layers 1002–1005 are formed subsequently on the semi-insulative GaAs substrate 1001 to form epitaxial substrate.

It is needless to say that, even when the N-type GaAs layer 1003 doped with Te, which serves as the carrier supply layer, is replaced with the N-type GaAs layer doped with Se, the same effect as the above can be obtained.

(Eighth Embodiment)

Figure 11:
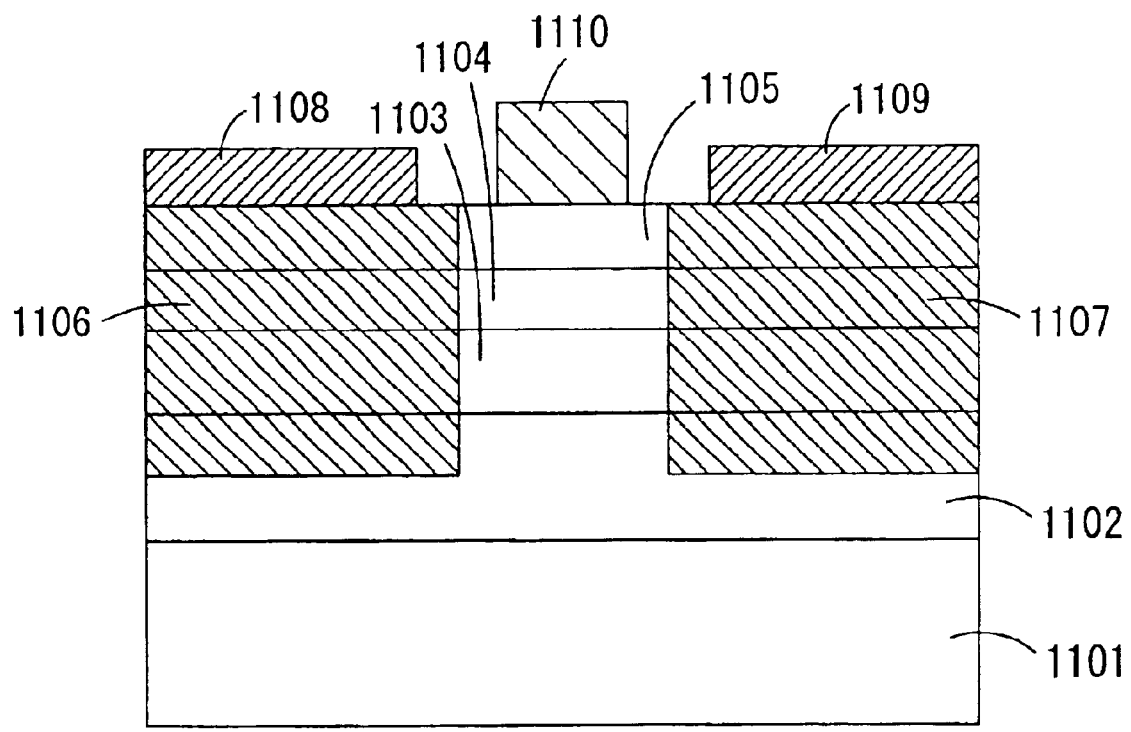
FIG. 11 is a cross sectional view showing a structure of a heterojunction FET according to a eighth embodiment of the invention.

FIG. 11 is a cross sectional view showing a structure of a heterojunction FET according to an eighth embodiment of the invention. In FIG. 11, formed on a semi-insulative InP substrate 1101 are an undoped InP buffer layer 1102, an N-type InP layer 1103 doped with Te, which serves as an active layer, an undoped $In_{0.52}Al_{0.48}As$ layer 1004, and an undoped InP layer 1105. Reference numeral 1106 denotes an $N^+$-type source area formed of an Si ion implanted area, 1107 denotes an $N^+$-type drain area formed of an Si ion implanted area, 1108 denotes a source electrode formed of materials from AuGe/Ni group, 1109 denotes a drain electrode formed of materials from AuGe/Ni group, and 1110 denotes a gate electrode formed from WSi/W.

The eighth embodiment is an example of a case in which no carrier supply layer is provided and the active layer is an N-type InP layer doped with Te. According to the eighth embodiment, since the N-type InP layer 1103 doped with Te is used as the active layer, the same effect as that of the first embodiment can be obtained. The manufacturing method of the heterojunction FET according to the eighth embodiment is the same as that of the first embodiment excepting a point that epitaxial layers 1102–1105 are formed subsequently on the semi-insulative InP substrate 1101 to form epitaxial substrate.

It is needless to say that, even when the N-type InP layer 1103 doped with Te, which serves as the active layer, is replaced with the N-type InP layer doped with Se, the same effect as the above can be obtained.

Further, in the above description, in the case of a structure in which an N-type carrier supply layer is provided, it is such structured that the N-type carrier supply layer is formed at the upper side of the active layer. However, it is needless to say that the invention is applicable in the same manner as the above to a double-hetero structure in which the N-type carrier supply layers are provided at the both sides of the active layer. In this case, any one of the two N-type carrier supply layers formed at the both sides of the active layer may be doped by Se or Te; thereby the effect of the invention is obtained. However, when the both sides are doped with Se or Te, a higher effect can be obtained.

Furthermore, it is needless to say that the invention is also applicable to an LDD (Lightly Doped Drain) structure in which an N-type area having a medium carrier density is formed between an $N^+$-type source/drain area and a gate electrode.

Still further, it is needles to say that the same effect can be obtained even when the film structure, film composition or the like of the epitaxial substrate including the gate electrode structure and buffer layer are appropriately altered.

As described above, in an N-type carrier supply layer or N-type active layer of a heterojunction epitaxial substrate included in AlGaAs/InGaAs group, InAlAs/InGaAs group, AlGaAs/GaAs group, or the like, doping with Se or Te is made in place of Si which is conventionally used. In high temperature annealing process for activating the ion implanted areas, which serves as source and drain areas, unlike the Si donor, inactivation of donor due to reaction with F-atoms occurs scarcely with respect to the diffusion of F-atoms on the surface of the epitaxial substrate, which adhered during the process. Further, since the Se and Te are impurities from VI-family, when the Se or Te occupies any grid position of atoms from III-family or V-family, the Se or Te serves as the donor. Accordingly, a high performance heterojunction FET of little deterioration of the FET characteristics can be obtained.

What is claimed is:

1. A method of manufacturing a heterojunction field effect transistor, the method comprising:
    epitaxially forming a composite substrate, having a plurality of semiconductor layers on a semi-insulative substrate, the semiconductor layers including a semiconductor layer that serves as an active layer and at least one other semiconductor layer, formed over the upper side or both over the upper side and under the lower side of said active layer, that serves as an N-type carrier supply layer for supplying an electron to said active layer;
    diffusing F atoms on the surface of the epitaxial substrate;
    forming a gate electrode on said composite substrate; and
    forming N-type source and drain areas, by carrying out:
        ion injection for forming N-type semiconductors in predetermined areas of said composite substrate, each of said source and drain areas formed to one side of said gate electrode, and
        an annealing process for activating the ion injected areas, wherein:
    said upper-side N-type carrier supply layer, between said source area and said drain area, is doped with Selenium (Se) or Tellurium (Te), or
    at least one of said upper- and lower-side N-type carrier supply layers, between said source area and said drain area, is doped with Selenium (Se) or Tellurium (Te).

2. The manufacturing method of claim 1, wherein:
    said active layer is formed of InGaAs, and
    said upper-side N-type carrier supply layer is formed of AlGaAs or at least one of said upper- and lower-side N-type carrier supply layers is formed of AlGaAs.

3. The manufacturing method of claim 1, wherein:
    said active layer is formed of InGaAs, and
    said upper-side N-type carrier supply layer is formed of InAlAs or at least one of said upper- and lower-side N-type carrier supply layers is formed of InAlAs.

4. The manufacturing method of claim 1, wherein:
    said active layer is formed of GaAs, and
    said upper-side N-type carrier supply layer is formed of AlGaAs or at least one of said upper- and lower-side N-type carrier supply layers is formed of AlGaAs.

5. The method of claim 1, wherein the annealing process for activating the ion injected areas is carried out in a manner of lamp annealing.

6. The method claim 1, wherein the annealing temperature is in the range of 700° C. to 850° C.

7. A method of manufacturing a heterojunction field effect transistor, the method comprising:
    epitaxially forming a composite substrate, having a plurality of semiconductor layers on a semi-insulative substrate, said plurality of semiconductor layers including a semiconductor layer that serves as an N-type active layer;
    diffusing F atoms on the surface of the epitaxial substrate;
    forming a gate electrode on said composite substrate; and
    forming N-type source and drain areas, by carrying out:
        ion injection for forming N-type semiconductors in predetermined areas of said composite substrate, each of said source and drain areas formed to one side of said gate electrode, and
        an annealing process for activating the ion injected areas, wherein:
    when forming said composite substrate, said semiconductor layer serving as said N-type active layer is doped with Selenium (Se) or Tellurium (Te).

8. The method of claim 7, wherein said N-type active layer is an InGaAs layer, a GaAs layer, or an InP layer.

9. The method claim 7, wherein the annealing process for activating the ion injected areas is carried out in a manner of lamp annealing.

10. The method claim 7, wherein the annealing temperature is in the range of 700° C. to 850° C.

* * * * *